US010283558B1

(12) United States Patent
Manabe et al.

(10) Patent No.: US 10,283,558 B1
(45) Date of Patent: May 7, 2019

(54) FLOATING DIFFUSION OF IMAGE SENSOR WITH LOW LEAKAGE CURRENT

(71) Applicant: OmniVision Technologies, Inc., Santa Clara, CA (US)

(72) Inventors: Sohei Manabe, San Jose, CA (US); Keiji Mabuchi, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/972,380

(22) Filed: May 7, 2018

(51) Int. Cl.
*H01L 27/146* (2006.01)
*H04N 5/359* (2011.01)
*H04N 5/378* (2011.01)

(52) U.S. Cl.
CPC .... *H01L 27/14698* (2013.01); *H01L 27/1461* (2013.01); *H01L 27/14643* (2013.01); *H04N 5/359* (2013.01); *H04N 5/378* (2013.01)

(58) Field of Classification Search
CPC ........... H01L 27/14698; H01L 27/1461; H01L 27/14643; H04N 5/378; H04N 5/359
See application file for complete search history.

(56) References Cited

U.S. PATENT DOCUMENTS 7,115,855 B2 * 10/2006 Hong ................ H01L 27/14609
250/214.1

* cited by examiner

*Primary Examiner* — Kyoung Lee
(74) *Attorney, Agent, or Firm* — Christensen O'Connor Johnson Kindness PLLC

(57) ABSTRACT

An image sensor including a photodiode, a floating diffusion region, a first, second, and third doped region of a semiconductor material, and a first capacitor is presented. The photodiode is disposed in the semiconductor material to generate image charge in response to incident light. The floating diffusion region is disposed in the semiconductor material proximate to the photodiode. The floating diffusion region is at least partially surrounded by the first doped region of the semiconductor material. The second doped region and the third doped region of the semiconductor material each have an opposite polarity of the floating diffusion region and the first doped region. The floating diffusion region and at least part of the first doped region are laterally disposed between the second doped region and the third doped region.

20 Claims, 5 Drawing Sheets

FLOATING DIFFUSION OF IMAGE SENSOR WITH LOW LEAKAGE CURRENT

TECHNICAL FIELD

This disclosure relates generally to semiconductor devices, and in particular but not exclusively, relates to CMOS image sensors.

BACKGROUND INFORMATION

Image sensors have become ubiquitous. They are widely used in digital devices such as still cameras, cellular phones, video cameras, as well as, medical, automobile, security, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

However, as the miniaturization of image sensors progresses, defects within the image sensor architecture become more readily apparent and may reduce the image quality of the image. For example, excess current leakage within certain regions of image sensor may cause high dark current, sensor noise, white pixel defects, and the like. These defects may significantly deteriorate the image quality from the image sensor, which may result in reduced yield and higher production costs.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
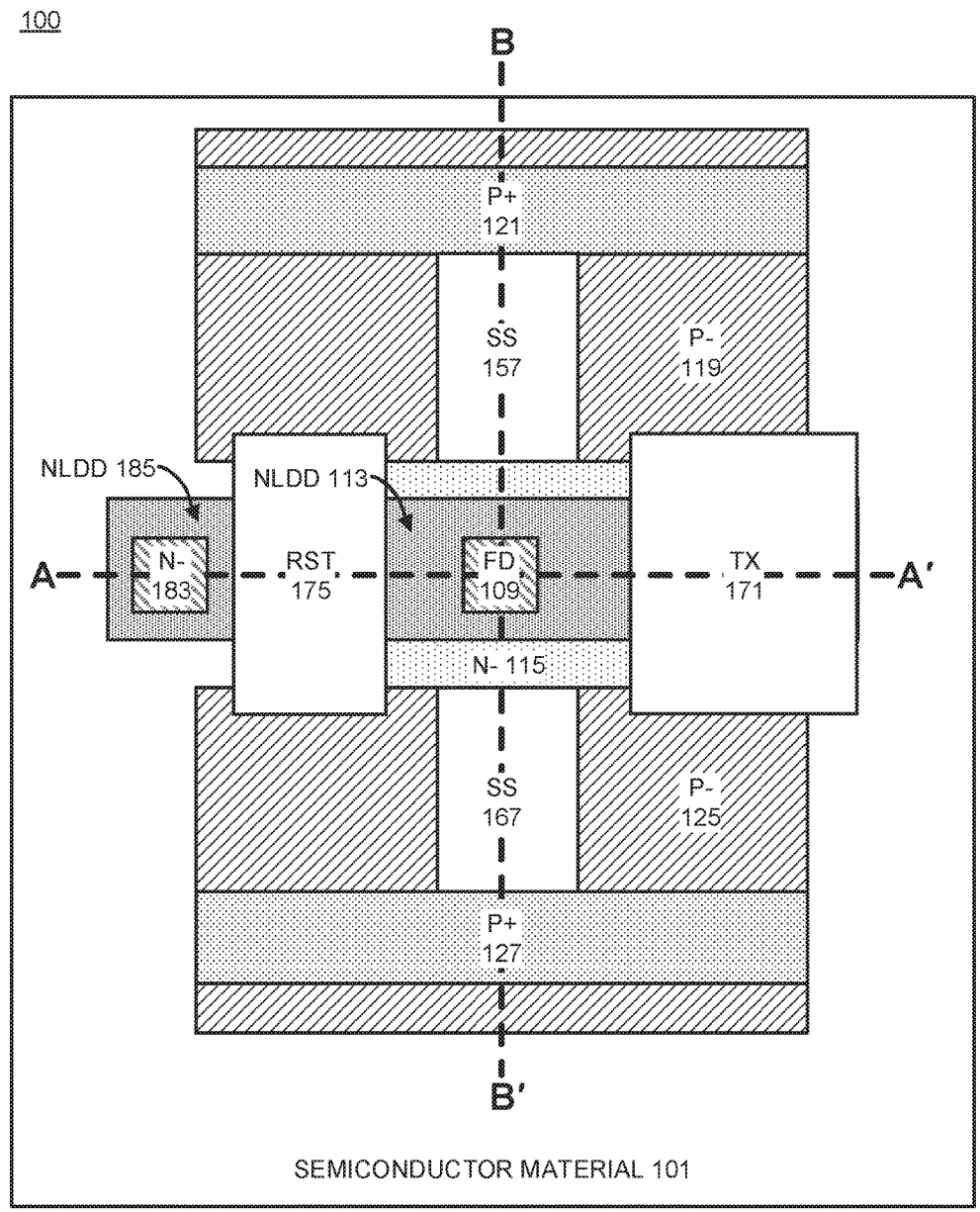
FIG. 1A is a top-down illustration of an example image sensor, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus for an image sensor with a floating diffusion having a low leakage current are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

In some embodiments, an image sensor having a floating diffusion region with low leakage current is described. Minimizing or reducing the leaking current at or near the floating diffusion region of the image sensor may facilitate increased image quality, increased yield, and increased operational lifetime. For example, leakage current at or near the floating diffusion region may impact signal readout from the floating diffusion region by readout circuitry due to deficiencies such as a high dark current, white pixel defects, low signal-to-noise ratio, and the like. White pixel defects, for example, may be related to current leakage from regions subjected to mechanical stress during fabrication, electrical stress during device operation, or a combination thereof. Leakage current may be a particularly significant issue when the image charge, image data, or image signal is stored within the floating diffusion region for long periods of time before readout, such as 0.1 milliseconds. Accordingly, some image sensors utilizing a global shutter architecture and/or lateral overflow integration capacitors may be prone to these issues arising from leakage current due to their tendency to store image charge for an extended period of time. However, embodiments of the present disclosure mitigate or reduce such issues by utilizing image sensor architectures described herein. These embodiments, for example, may allow for an increased full well capacity and subsequently improved high dynamic range.

Embodiments of the present disclosure utilize an image sensor architecture with various features to form image sensors having a floating diffusion with low leakage current. For example, in some embodiments, the floating diffusion region is an N+ implant region within a semiconductor material. The N+ implant region may have implant damage within an NLDD (n-type lightly doped drain) region of the semiconductor material that surrounds, at least partially, the N+ implant region. The implant damage may be a result of a fabrication technique (e.g. implantation to form the N+ implant region) and correspond to an area of mechanical stress or damage of the image sensor, which may result in leakage current. In some embodiments, the impact of the implant damage may be at least partially mitigated by incorporating an N− doped region of the semiconductor material surrounding, at least partially, the NLDD region. Subsequently, the NLDD region is disposed between the N− doped region and the N+ implant region. The described configuration of the N+ implant region, NLDD region, and N− doped region may result in the depletion region proximate to the N+ region (e.g., from a transfer transistor, reset transistor, or the like) from not extending into (and thus may not be affected by) the region with the implant damage (e.g., the NLDD region).

In the same or other embodiments, the floating diffusion region is surrounded, at least partially, by capacitors, which are biased to a negative voltage to shield the Si surface (e.g., of the semiconductor material). The negative bias may prevent the Si surface from not being depleted. In one embodiment, a negatively biased capacitor (e.g., MOS capacitor) is utilized to quench surface-interface traps near or at a surface of the semiconductor material and proximate to the floating diffusion region (e.g., N+ implant region). Trapped sites, dangling bonds, and the like proximate to the surface of the semiconductor material may increase dark current of the image sensor. This increase in dark current due to surface-interface traps may be partially mitigated by the capacitors. In some embodiments, the capacitors may be a metal-oxide-semiconductor (MOS) capacitor, in which the metal may be polycrystalline silicon (poly-Si), tungsten (W) and the like, the oxide may be a dielectric such as $SiO_2$ (e.g., thermally grown or deposited on the semiconductor material), and the semiconductor may correspond to a portion of the semiconductor material.

In some embodiments, a silicon nitride ($Si_3N_4$) side wall is deposited at interfaces between a gate electrode (e.g., a transfer gate, reset gate, and the like) as an insulator and chemical barrier for the image sensor. However, the silicon nitride sidewalls may result in additional mechanical stress to the semiconductor material causing crystal defects and potentially increased leakage current. Therefore, in some embodiments, the silicon nitride sidewall may be explicitly omitted in the image sensor architecture, such that $Si_3N_4$ does not coat the sidewalls of the gate electrodes. Rather, the NLDD region may extend directly to the sidewalls of the gate electrodes.

In the same or other embodiments, the floating diffusion region (e.g., the N+ implant region) is surrounded, at least partially, by a P+ doped region of the semiconductor. The P+ doped region being surrounded, at least partially by a P− doped region of the semiconductor, such that the P− region is disposed between the N+ implant region and the P+ region. The P+ region surrounded by the P− region acts as a gettering region to attract impurities within the semiconductor material. For example, metal or heavy metal impurities may migrate or diffuse from the semiconductor material towards the P+ region to lower their energy. Thus, the P+ region surrounded by the P− region may act to reduce generation-recombination centers caused by impurities, which may be a source of leakage current or white pixel defects.

Figure 1B:
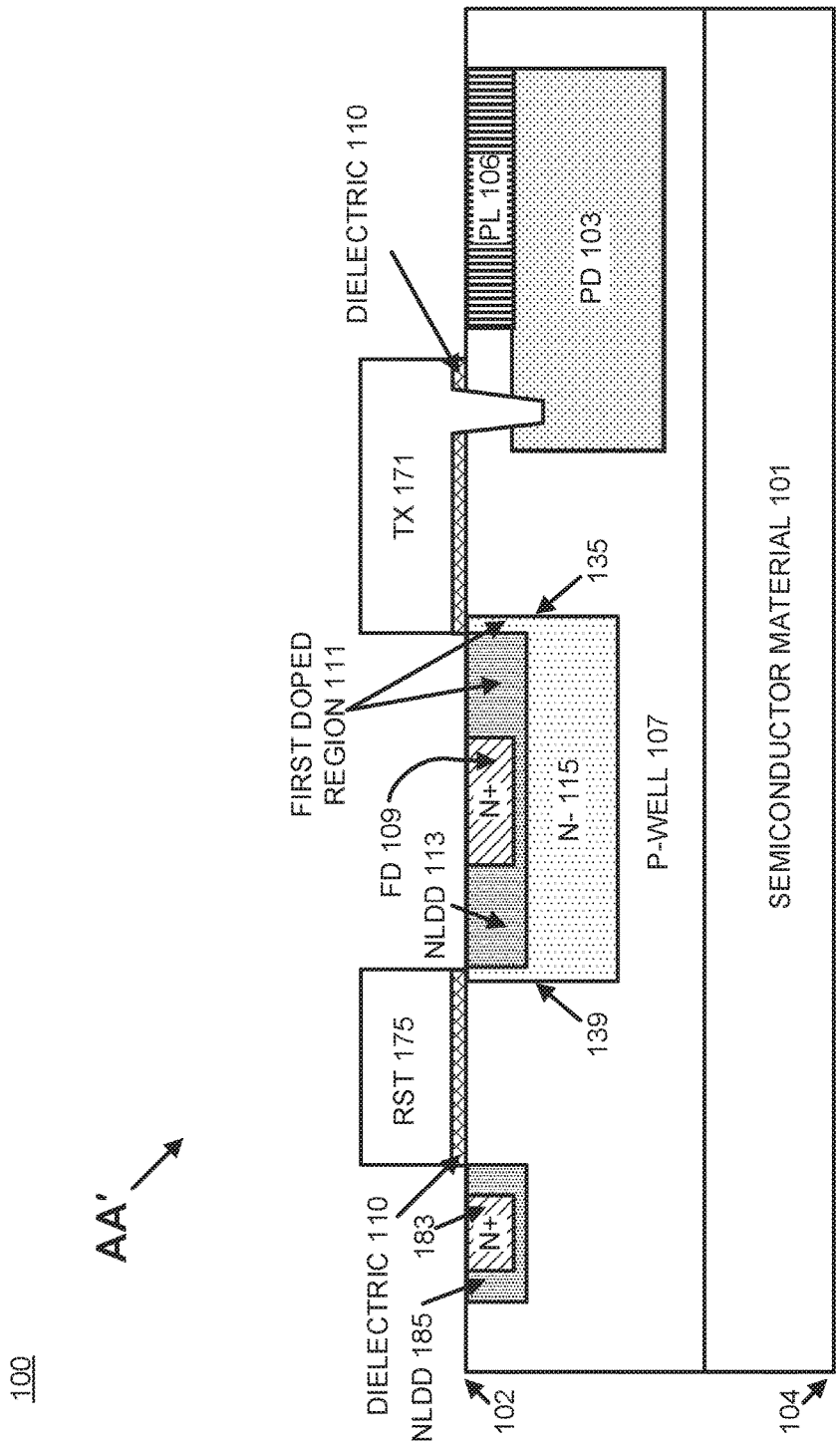
FIG. 1B is a cross-sectional illustration of the image sensor in FIG. 1A as cut along line A-A', in accordance with the teachings of the present disclosure.
Figure 1C:
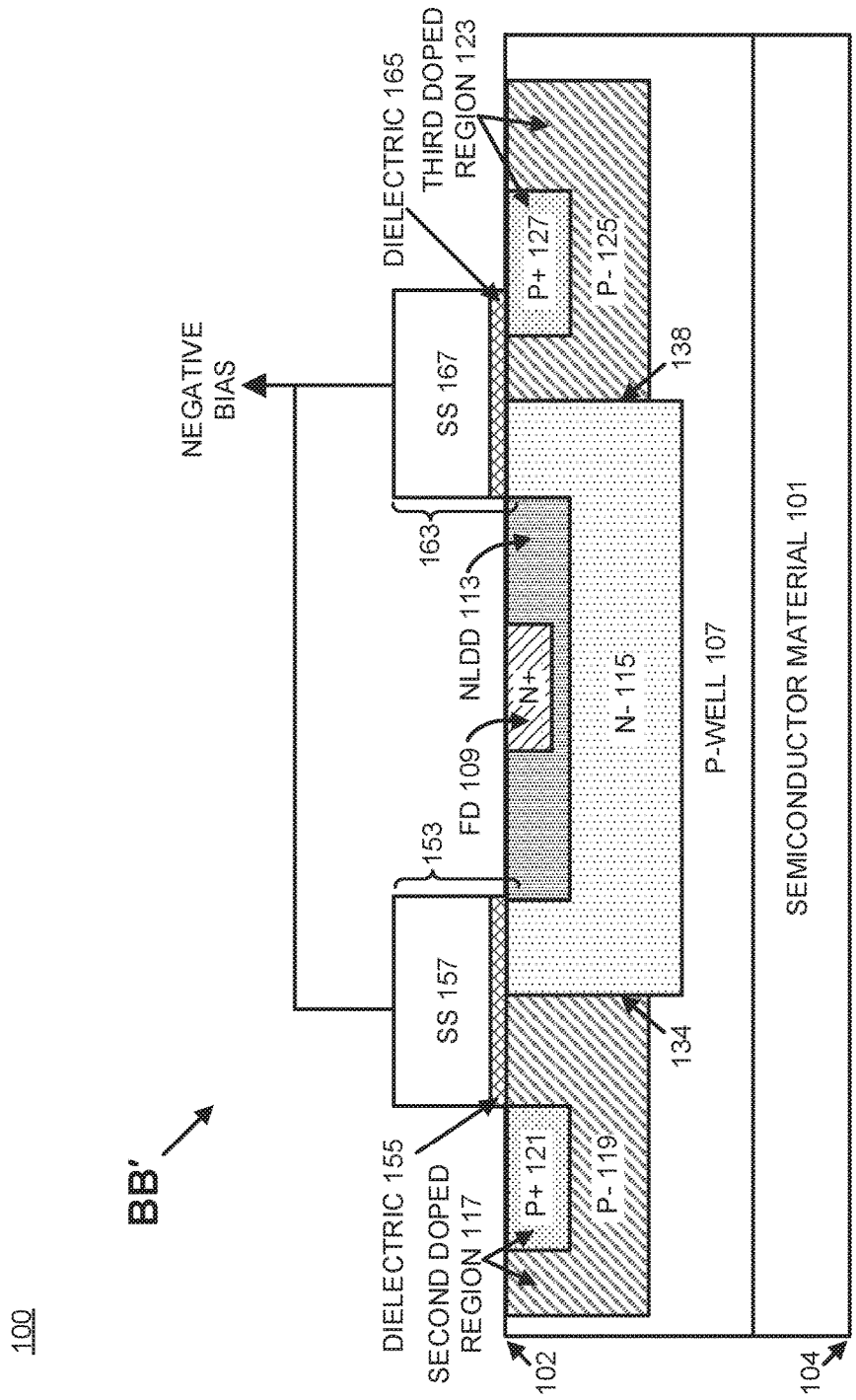
FIG. 1C is a cross-sectional illustration of the image sensor in FIG. 1A as cut along line B-B', in accordance with the teachings of the present disclosure.

FIGS. 1A-1C are top-down and cross-sectional illustrations of an example image sensor 100 with a floating diffusion having low leakage current, in accordance with the teachings of the present disclosure. As will be shown in FIGS. 1A-1C, image sensor 100 includes semiconductor material 101, photodiode 103, pinning layer 106, p-well 107, floating diffusion 109, gate dielectric 110, first doped region 111, second doped region 117, third doped region 123, first capacitor 153, second capacitor 163, transfer gate 171, and reset gate 175. The first doped region 111 includes a first portion 113 and a second portion 115. The second doped region 117 and third doped region 123 each respectively include a third portion 121/127 and a fourth portion 119/125. The first capacitor 153 includes a first dielectric layer 155 and a first electrode 157. The second capacitor includes a second dielectric layer 165 and a second electrode 167.

In some embodiments, a variety of materials and fabrication techniques may be utilized to form the image sensor 100. The semiconductor material 101 may have a composition of Si (e.g., single crystal or polycrystalline Si). The first electrode 157 and/or the second electrode 167 may have a composition including tungsten or polycrystalline silicon. The first dielectric layer 155 and the second dielectric layer 165 may have a composition of $SiO_2$, $HfO_2$, or any other suitable dielectric medium known by one of ordinary skill in the art. Other metals, semiconductors, and insulating materials may also be utilized for image sensor 100, as known by one of ordinary skill in the art. Doped regions of the semiconductor material 101 may be formed by diffusion, implantation, and the like. Fabrication techniques such as photolithography, chemical etching, ion implantation, thermal evaporation, chemical vapor deposition, sputtering, and the like, as known by one of ordinary skill in the art, may be utilized to fabricate the image sensor 100.

FIG. 1A is a top-down illustration of the image sensor 100, in accordance with the teachings of the present disclosure. As illustrated, image sensor 100 will be described along two directions that are orthogonal to one another. The first direction being along line A-A' and the second direction being along line B-B'.

FIG. 1B is a cross-sectional illustration of the image sensor 100 in FIG. 1A as cut along line A-A', in accordance with the teachings of the present disclosure. As illustrated, the photodiode 103 is disposed in the semiconductor material 101 to generate the image charge in response to incident light. In some embodiments, the photodiode 103 may be a pinned or partially pinned photodiode, in which the pinning layer 106 is disposed between a first side 102 of the semiconductor material 101 and the photodiode 103. The semiconductor material 101 having the first side 102 opposite of a second side 104. The pinning layer 106 may reduce dark current and increase quantum efficiency of the photodiode 103 by inhibiting surface-interface traps proximate to the first side 102 of the semiconductor material 101.

As illustrated, the transfer gate 171 is electrically coupled between the photodiode 103 and the floating diffusion region 109. Image charge generated by the photodiode 103 may be transferred to the floating diffusion region 109 in response to a transfer signal applied to the transfer gate 171. In some embodiments, the transfer gate is a vertical transfer gate. In other words, the transfer gate may be part of a vertical transistor. Similarly, the reset gate 175 is electrically coupled to the floating diffusion region 109 to drain the image charge from the floating diffusion region 109 in response to a reset signal being applied to the reset gate 175. As illustrated, the gate dielectric 110 is disposed between the first side 102 of the semiconductor material 101 and both the transfer gate 171 and the reset gate 175.

In the illustrated embodiment, the floating diffusion region 109 is disposed in the semiconductor material 101 proximate to the photodiode 103. More specifically, in some embodiments, the floating diffusion region 109 and the photodiode 103 are oriented along a first direction A-A'. The floating diffusion region is at least partially surrounded by a first doped region 111 of the semiconductor material. The first doped region 111 may include a first portion 113 disposed between the floating diffusion region 109 and the second portion 115 of the first doped region 111. In some embodiments, a first doping concentration of the semiconductor material 101 decreases from the floating diffusion region 109 to the second portion 115 of the first doped region 111. For example, in some embodiments, the floating diffusion region 109 has an N+ doping profile, the first portion 113 has a n-type lightly doped profile (e.g., n-type lightly doped drain), and the second portion 115 has an N− doping profile.

In some embodiments, the configuration of the first doped region 111 and the floating diffusion region 109 reduces leakage current by keeping implant damage away from a depletion region. For example, in some embodiments, the floating diffusion region 109 and the first doped region 111 may be at least partially disposed within the p-well 107. Thus, as illustrated, the second portion 115 of the first doped region 111 is disposed proximate to the p-well 107. The depletion region may correspond to a region of the semiconductor material 101 where the second portion 115 (n-type) and the p-well 107 (p-type) interface (e.g., interface 135 under the transfer gate 171 and/or interface 139 under the reset gate 175). Implant damage (e.g., from an implantation technique utilized to fabricate the floating diffusion region 109) may extend into the first portion 113 but not into the second portion 115. In other words, a depletion region proximate to the photodiode 103 (e.g., near the first side 102 of the semiconductor material 101 and between the floating diffusion region 109 and the photodiode 103) does not extend into the floating diffusion region 109 where there is possible implant damage. Thus, the second portion 115 may act as a barrier and limit the influence of implant damage to the depletion region. Implant damage in undepleted regions (e.g., the floating diffusion region 109 and the first portion 113) should not have a negative effect on dark current or introduce white pixel defect.

FIG. 1C is a cross-sectional illustration of the image sensor 100 in FIG. 1A, as cut along line B-B', in accordance with the teachings of the present disclosure. As illustrated, the semiconductor material 101 of the image sensor 100 includes the second doped region 117 and the third doped region 123. In some embodiments, the second doped region 117 and the third doped region 123 have an opposite polarity of the floating diffusion region 109 and the first doped region 111 (e.g., the first portion 113 and the second portion 115). In some embodiments, the floating diffusion region 109 and the first doped region 111 are n-type (e.g., a larger electron concentration than hole concentration), while the second doped region 117 and third doped region 127 are p-type (e.g., a larger hole concentration than electron concentration).

As illustrated, the floating diffusion region 109 and at least part of the first doped region 111 (e.g., part of the first portion 113 and part of the second portion 115) are laterally disposed between the second doped region 117 and the third doped region 123. In some embodiments, the floating diffusion region 109, the first doped region 111 (e.g., the first portion 113 and the second portion 115), the second doped region 117, and the third doped region 123 extend to the first side 102 of the semiconductor material 101.

In the same or other embodiments, the second doped region 117 may include the third portion 121 and the fourth portion 119. The third doped region 123 may also include the third portion 127 and the fourth portion 125. As illustrated, the third portion 121 may be at least partially surrounded by the fourth portion 119. Similarly, the third portion 127 may also be at least partially surrounded by the fourth portion 125. The third portion 121/127 may have a P+ doping profile or concentration, while the fourth portion 119/125 may have a P− doping profile or concentration.

The second doped region 117 and the third doped region 123 may represent gettering sites to absorb impurities in the semiconductor material 101. For example, it may be energetically for impurities or defects within the semiconductor material 101 to transition from the first doped region 111 to the second doped region 117 or the third doped region 123. By providing an energetically favorable location for impurities to reside or diffuse to (e.g., the third portion 121/127), the impact of such impurities on the leakage current of the image sensor 100 may be at least partially mitigated.

In some embodiments, the second portion 115 of the first doped region 111 extends laterally along the first side 102 of the semiconductor material 101. The second portion 115 may meet or interface with the second doped region at a first interface 134. Similarly, the second portion 115 may meet or interface with the third doped region 123 at a second interface 138.

In the same or other embodiments, the first capacitor 153 and the second capacitor 163 may be disposed proximate to the first interface 134 and the second interface 138. For example, the first capacitor 153 may be positioned proximate to the first interface 134 between the first doped region 111 (e.g., the first portion 113 and the second portion 115) and the second doped region 117. In other embodiments, the first capacitor 153 may be positioned proximate to the second interface 138 between the first doped region 111 and the third doped region 123. In yet other embodiments, the image sensor 100 may include the first capacitor 153 and the second capacitor 163. The first capacitor 153 may be positioned proximate to the first interface 134 and the second capacitor 163 may be positioned proximate to the second interface 138. As illustrated, the first capacitor 153 may extend laterally from at least the first portion 115 of the first doped region 111 to the third portion 121 of the second doped region 117. Similarly, the second capacitor 153 may extend laterally from at least the first portion 115 of the first doped region 111 to the third portion 127 of the third doped region 123. Furthermore, the first capacitor 153, the second capacitor 163, and the floating diffusion region 109 are oriented along a second direction B-B'. The second direction being orthogonal to the first direction.

In some embodiments, the first capacitor 153 and the second capacitor 163 are metal-oxide-semiconductor (MOS) capacitors. For example, the first capacitor 153 may include a first dielectric layer 155 and a first electrode 157. A first segment of the semiconductor material 101 disposed proximate to the first dielectric layer 153 may be considered as the semiconductor portion of the first capacitor 153. The first segment being located proximate to the first interface 134. As illustrated, the first dielectric layer 155 is disposed between the first electrode 157 and the first segment of the semiconductor material. More specifically, the first dielectric layer 155 may extend from the first electrode 157 to the first side 102 of the semiconductor material 101 and be disposed between the first electrode 157 and the first interface 134. The second capacitor 163 may include a second dielectric layer 165 and a second electrode 167. Similarly, a second segment of the semiconductor material 101 disposed proximate to the second dielectric layer 165 may be considered as the semiconductor portion of the second capacitor 163. The second segment being located proximate to the second interface 138. As illustrated, the second capacitor 163 may have a similar position configuration of elements as the first capacitor 153. More specifically, the second dielectric layer 165 may be disposed between the second electrode 167 and the second interface 138.

In some embodiments, the first capacitor 153 and/or the second capacitor 163 may be utilized shield the semiconductor material 101 from crystal defects, surface-interface charge traps, dangling bonds, impurities, and the like that may be located proximate to first side 102 of the semiconductor material 101 and the respective first capacitor 153 or the second capacitor 163. For example, in some embodiments, the first capacitor 153 is electrically coupled to the second capacitor 163 and positioned proximate to the first side 102 of the semiconductor material 101. Therefore, in response to a bias (e.g., negative bias) applied to the first capacitor 153 and the second capacitor 163, holes may be laterally induced across the first side 102 between the floating diffusion region 109 and the first interface 134 or between the floating diffusion region 109 and the second interface 138. These generated holes may quench surface-interface trap states proximate to the first side 102 of the semiconductor material 101. Quenching the surface-interface trap states may prevent the trap states from impacting the leakage current (e.g., dark current, white pixel defects, etc.) of the image sensor 100.

Figure 2:
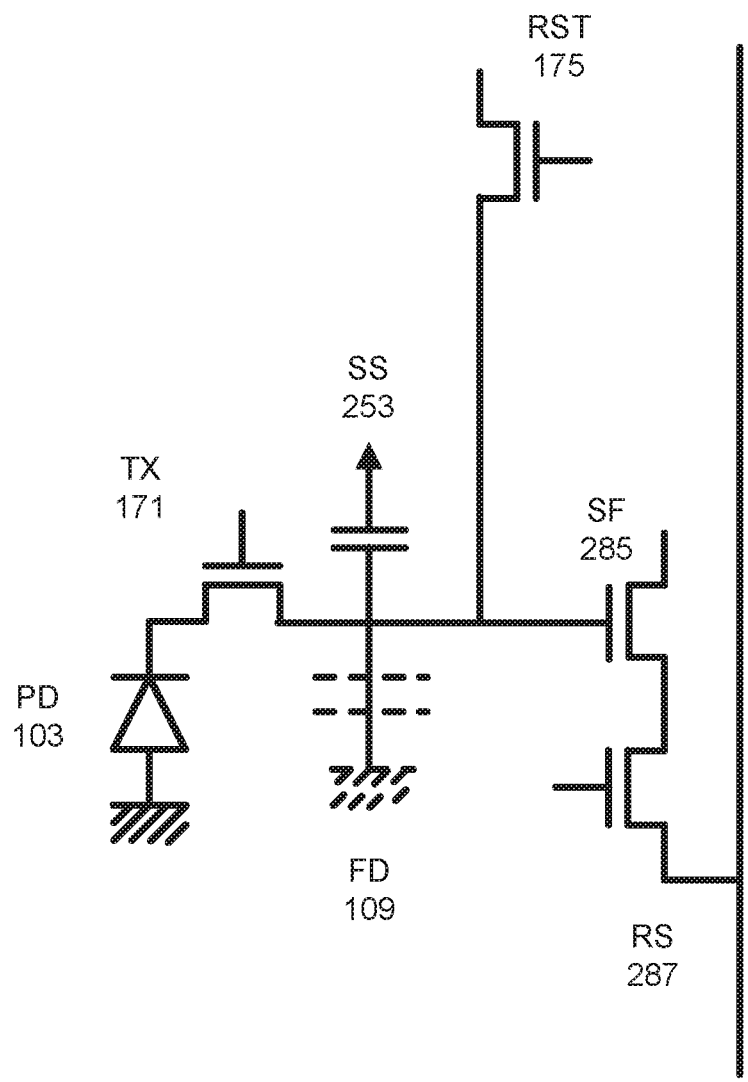
FIG. 2 shows a circuit diagram of an embodiment 4T unit pixel cell which may include the image sensor of FIGS. 1A-1C, in accordance with the teachings of the present disclosure.

FIG. 2 shows a circuit diagram of an embodiment 4T unit pixel cell, which may include the image sensor 100 of FIGS. 1A-1C, in accordance with the teachings of the present disclosure. The 4T unit pixel cell may include the photodiode 103, the transfer gate/transistor 171, the floating diffusion region 109, the reset gate/transistor 175, source-follower transistor 285, row select transistor 287, and storage node structure (SS) 253. SS 253 may be coupled to one or more capacitors (e.g., the first capacitor 153 and the second capacitor 163 of FIGS. 1A-1C).

During a readout operation of the photodiode 103, the transfer transistor 171 receives a transfer signal, which causes the transfer transistor 171 to transfer the image charge accumulated in the photodiode 103 to the floating diffusion region 109. In some embodiments, while the floating diffusion region 109 is storing the image charge, a bias (e.g., a negative bias) may be applied to SS 253 in order to induce holes to quench surface-interface trap sites to mitigate image charge inadvertently leaking from the floating diffusion 109. The reset transistor, RST 175, is coupled to the floating diffusion region 109 to reset (e.g., discharge or charge the floating diffusion region 109 to a preset voltage) in response to or under control of a reset signal. The floating diffusion region is also coupled to the gate of the source-follower transistor, SF 285, which in turn is coupled to the row select transistors, RS 287. SF 285 operates as a source-follower providing a high impedance output from the floating diffusion region 209. The RS 287 selectively couples the output of pixel circuitry to a column bitline under control of a row select signal. In some embodiments, the transfer signal, the reset signal, and the row select signal are generated by control circuitry (not illustrated).

Figure 3:
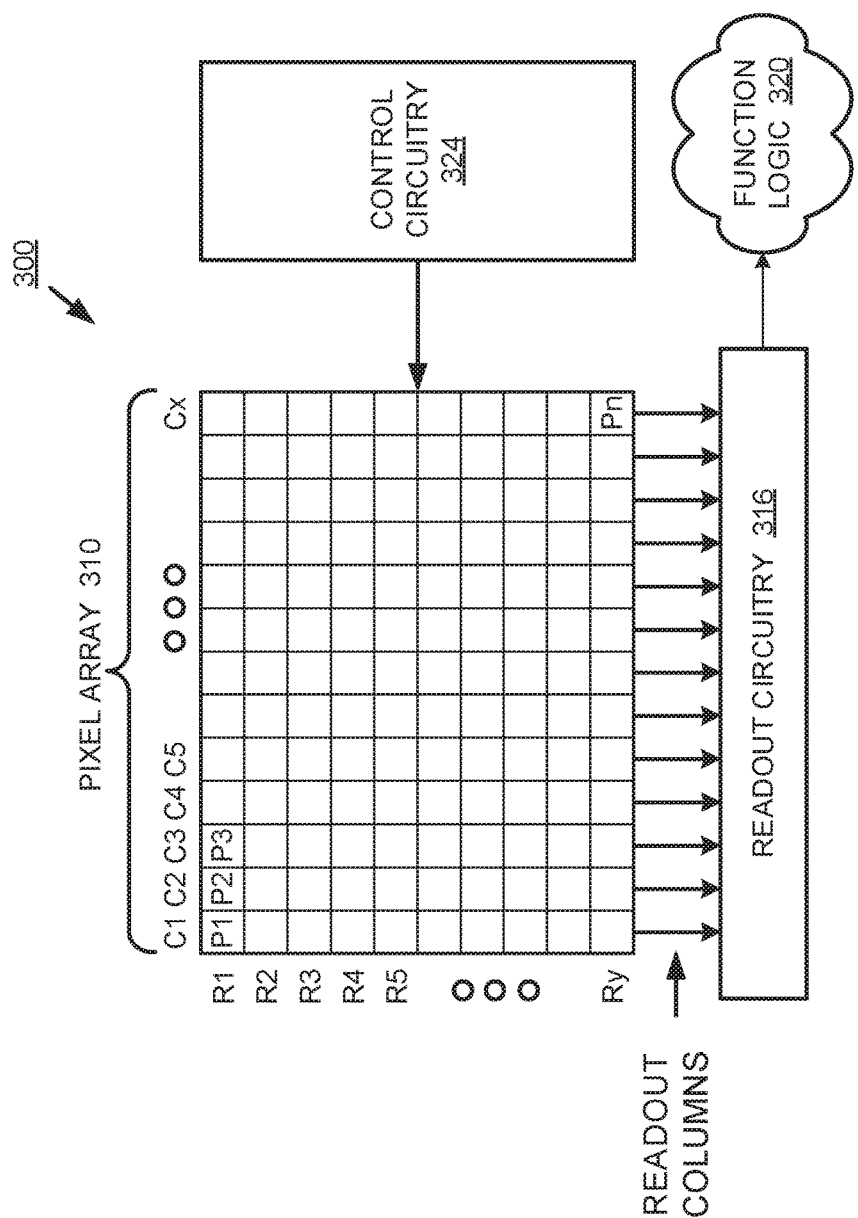
FIG. 3 is a block diagram illustrating one example of an imaging system which may include the image sensor of FIGS. 1A-1C, in accordance with the teachings of the present disclosure.

FIG. 3 is a block diagram illustrating one example of an imaging system 300, which may include the image sensor 100 of FIGS. 1A-1C, in accordance with the teachings of the present disclosure. The imaging system 300 includes pixel array 310, readout circuitry 316, function logic 320, and control circuitry 324. In one embodiment, pixel array 310 is a two-dimensional (2D) array of photodiodes, or image sensor pixels (e.g., pixels P1, P2 . . . , Pn). As illustrated, photodiodes are arranged into rows (e.g., row R1 to Ry) and columns (e.g., column C1 to Cx) to acquire image data of a person, place, object, etc., which can then be used to render a 2D image of the person, place, object, etc. However, photodiodes do not necessarily have to be arranged into rows and columns, and may take other configurations.

In one example, after each image sensor photodiode/pixel in the pixel array 310 has acquired its image data or image charge, the image data is readout by the readout circuitry 316 and then transferred to the function logic 320. In various examples, the readout circuitry 316 may include amplification circuitry, analog-to-digital (ADC) conversion circuitry, or otherwise. The function logic 320 may simply store the image data or even manipulate the image data by applying post image effects (e.g., crop, rotate, remove red eye, adjust brightness, adjust contrast, or otherwise). In one example, the readout circuitry 316 may readout a row of image data at a time along readout column lines (illustrated) or may readout the image using a variety of other techniques (not illustrated), such as a serial readout or a full parallel readout of all pixels simultaneously.

In another embodiment, the control circuitry 324 is coupled to the pixel array 310 to control operation of the plurality of photodiodes in the pixel array 310. For example, the control circuitry 324 may generate a shutter signal for controlling image acquisition. In the depicted example, the shutter signal is a global shutter signal for simultaneously enabling all pixels within the pixel array 310 to simultaneously capture their respective image data or image charge during a single acquisition window. In another embodiment, image acquisition is synchronized with lighting effects such as a flash.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a photodiode disposed in a semiconductor material to generate image charge in response to incident light;
a floating diffusion region disposed in the semiconductor material proximate to the photodiode, wherein the floating diffusion region is at least partially surrounded by a first doped region of the semiconductor material;
a second doped region and a third doped region of the semiconductor material, each having an opposite polarity of the floating diffusion region and the first doped region, wherein the floating diffusion region and at least part of the first doped region are laterally disposed between the second doped region and the third doped region; and a first capacitor positioned proximate to a first interface between the first doped region and the second doped region or a second interface between the first doped region and the third doped region.

2. The image sensor of claim 1, wherein the floating diffusion region and the first doped region are n-type, and wherein the second doped region and the third doped region are p-type.

3. The image sensor of claim 1, wherein the first doped region includes a first portion disposed between the floating diffusion region and a second portion of the first doped region, wherein a first doping concentration of the semiconductor material decreases from the floating diffusion region to the second portion of the first doped region.

4. The image sensor of claim 3, wherein a depletion region proximate to the photodiode does not extend into the floating diffusion region.

5. The image sensor of claim 3, wherein the second doped region and the third doped region each include a third portion at least partially surrounded by a fourth portion, wherein a second doping concentration of the semiconductor material decreases from the third portion to the fourth portion.

6. The image sensor of claim 5, wherein the third portion and the fourth portion have a doping profile of P+ and P−, respectively.

7. The image sensor of claim 5, wherein the second doped region and the third doped region are gettering sites to absorb impurities in the semiconductor material.

8. The image sensor of claim 5, wherein the first capacitor is positioned proximate to the first interface, and wherein the first capacitor extends laterally from at least the first portion of the first doped region to the third portion of the second doped region.

9. The image sensor of claim 8, wherein the first capacitor includes a first dielectric layer and a first electrode, wherein the first dielectric layer is disposed between the first electrode and the first interface.

10. The image sensor of claim 9, wherein a composition of the first electrode includes tungsten or polycrystalline silicon.

11. The image sensor of claim 8, further comprising:
a second capacitor positioned proximate to the second interface, and wherein the second capacitor extends laterally from at least the first portion of the first doped region to the third portion of the third doped region.

12. The image sensor of claim 11, wherein the second capacitor includes a second dielectric layer and a second electrode, wherein the second dielectric layer is disposed between the second electrode and the second interface.

13. The image sensor of claim 11, wherein the floating diffusion region, the first doped region, the second doped region, and the third doped region extend to a first side of the semiconductor material, the first side opposite of a second side of the semiconductor material.

14. The image sensor of claim 13, wherein the first capacitor is electrically coupled to the second capacitor, wherein the first capacitor and the second capacitor are positioned proximate to the first side of the semiconductor material, and wherein in response to a negative bias applied to the first capacitor and the second capacitor, holes are induced laterally across the first side between the floating diffusion region and the first interface or between the floating diffusion region and the second interface.

15. The image sensor of claim 1, further comprising:
a transfer gate electrically coupled between the photodiode and the floating diffusion region to transfer the image charge from the photodiode to the floating diffusion region in response to a transfer signal applied to the transfer gate.

16. The image sensor of claim 15, wherein the transfer gate is a vertical transfer gate.

17. The image sensor of claim 1, further comprising:
a reset gate electrically coupled to the floating diffusion region, wherein in response to a reset signal, the reset gate resets the image charge in the floating diffusion region.

18. The image sensor of claim 1, wherein the floating diffusion region and the photodiode are oriented along a first direction, wherein the first capacitor and the floating diffusion region are oriented along a second direction, and wherein the first direction is orthogonal to the second direction.

19. The image sensor of claim 1, further comprising:
a pinning layer disposed between a first side of the semiconductor material and the photodiode, and wherein the photodiode is a partially pinned photodiode.

20. The image sensor of claim 1, further comprising:
a p-well positioned proximate to the photodiode, wherein the floating diffusion region and the first doped region are at least partially disposed within the p-well.

* * * * *